United States Patent [19]

Nishimoto et al.

[11] Patent Number: 4,845,670
[45] Date of Patent: Jul. 4, 1989

[54] MEMORY DEVICE USING SHIFT-REGISTER

[75] Inventors: Toshio Nishimoto, Takatsuki; Hideki Kawai, Nara; Masaru Fujii; Kiyoto Ohta, both of Takatsuji, all of Japan

[73] Assignee: Matsushita Electronics Corporation, Osaka, Japan

[21] Appl. No.: 15,348

[22] Filed: Feb. 17, 1987

[30] Foreign Application Priority Data

Feb. 18, 1986 [JP] Japan .................................. 61-34673

[51] Int. Cl.⁴ ............................................. G11C 21/00
[52] U.S. Cl. ......................................... 365/78; 377/64
[58] Field of Search ................. 365/78, 154, 189, 230; 307/221

[56] References Cited

U.S. PATENT DOCUMENTS 4,733,376 3/1988 Ogawa .................................. 365/78

Primary Examiner—Terrell W. Fears
Attorney, Agent, or Firm—Wenderoth, Lind & Ponack

[57] ABSTRACT

In a memory device, a shift-register comprises a plurality of stages for transferring sequentially a pair of signals which have mutually opposite phases. Each stage has a comparator circuit which compares the pair of signals and generates a pair of fixed voltage signals. By this construction, high-speed operation of the memory device, low power consumptions, and high-capacity load driving are achieved.

10 Claims, 3 Drawing Sheets

MEMORY DEVICE USING SHIFT-REGISTER

BACKGROUND OF THE INVENTION

The invention relates to a novel electric circuit, and more particularly to a novel shift-register and memory device.

Semiconductor memory devices in which shift-registers are included have recently been studied for obtaining a high-speed operation of the device. Some structures have been proposed. There are, however, serious problems in the conventional shift-register when applying it to a device for a high-speed operation. That is, the two characteristics of lower power consumptions and higher load driving capabilities (so called trans-conductance; gm), which are mutually incompatible, are demanded, and the conventional shift-register cannot meet these demands. Further, the output in a high level condition cannot be maintained for a long period using the conventional shift-registers.

SUMMARY OF THE INVENTION

The present invention solves the problems of conventional shift-registers described above, and makes possible semiconductor memory devices having a high-speed of operation.

The first object of this invention is to provide shift-registers capable of a high-speed of operation.

The second object of this invention is to provide shift-registers in which both a low power consumption and high-capacity load drive capability are achieved.

The third object of this invention is to provide shift-registers which are capable of holding the level of the output signal for a long period of time.

The fourth object of this invention is to provide a memory device which operates at a higher speed.

These and other objects are accomplished using the following construction. A shift register comprises a plurality of stages for transferring a pair of signals having mutually opposite phases. Each stage has an electric circuit, that is, a comparator circuit to which a pair of input signals having mutually opposite phases are applied for comparing said input signals and for generating a pair of fixed voltage signals according to the result of said comparison. A buffer circuit is providing for receiving said pair of fixed voltage signals and for changing the impedance exchange from higher impedance condition to a lower impedance condition. A latch circuit is provided for holding said pair of fixed voltage signals by means of an electrical latch function.

The above construction results in a shift-register having a low power consumptions and a high-capacity load drive capability. The shift-register is capable of holding the level of the output signal for a long period of time, and is a high-speed shift-register applicable to a high-speed semiconductor memory device.

While the novel features of the invention are set forth with particularity in the appended claims, the invention, both as to organization and content, will be better understood and appreciated, along with other objects and features thereof, from the following detailed description taken in conjunction with the drawings.

DETAILED DESCRIPTION OF THE INVENTION

Figure 1:
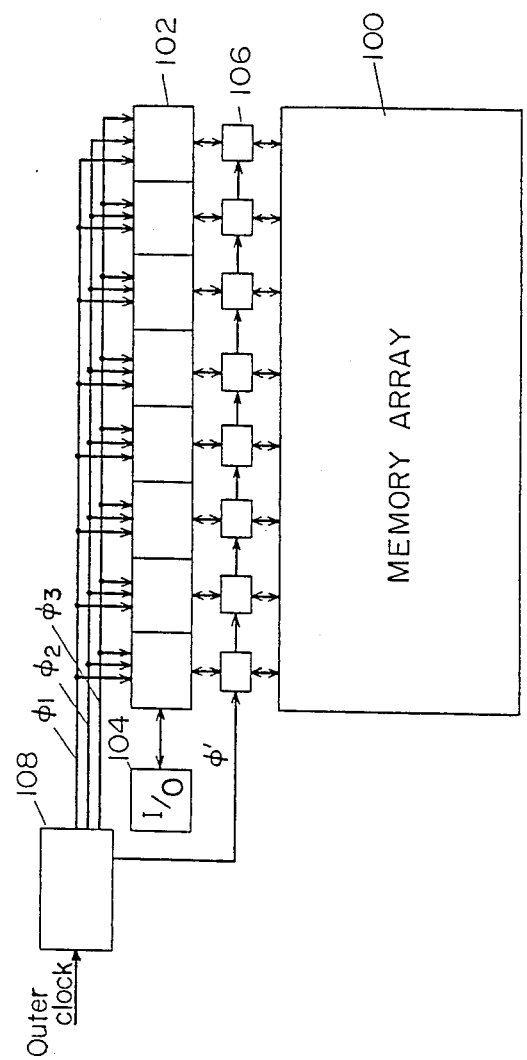
FIG. 1 is a block diagram of an embodiment of this invention in which the shift-register is applied to a semiconductor memory device.

FIG. 1 shows the basic construction of an embodiment of this invention. Reference number 100 designates a memory array which has a number of memory cells arranged in a matrix. Reference number 102 designates the shift-register which sequentially transmits signals from the input-output circuit 104, and which receives signals transferred from the memory array 100 through the switching circuit 106 and sequentially transmits them to the input-output circuit 104. They are controlled by the clock signals $\phi_1$, $\phi_2$ and $\phi_3$ generated by clock generator 108. The switching circuit 106 is also controlled by the clock signal $\phi'$ also generated from clock generator 108. In this embodiment, in a write mode, an 8-bit signal is supplied to the shift-register 102 from the input-output circuit 104. The signal is transmitted in series by means of the clock signals $\phi_1$, $\phi_2$ and $\phi_3$, and each bit-signal is stored in each stage of the shift-register. Next, at the input of clock signal $\phi'$ to the switching circuit 106, the signals stored in the stages are transmitted in parallel to the memory array 100 and stored. In a read mode, the signal stored in the memory array 100 is read-out and stored temporarily in each stage of the shift-register 102 when the clock signal $\phi'$ is applied to the switching circuit 106. The stored signal is then sequentially transmitted to the input-output circuit 104 at the clock signals $\phi_1$, $\phi_2$ and $\phi_3$ to shift-register 102.

Figure 2:
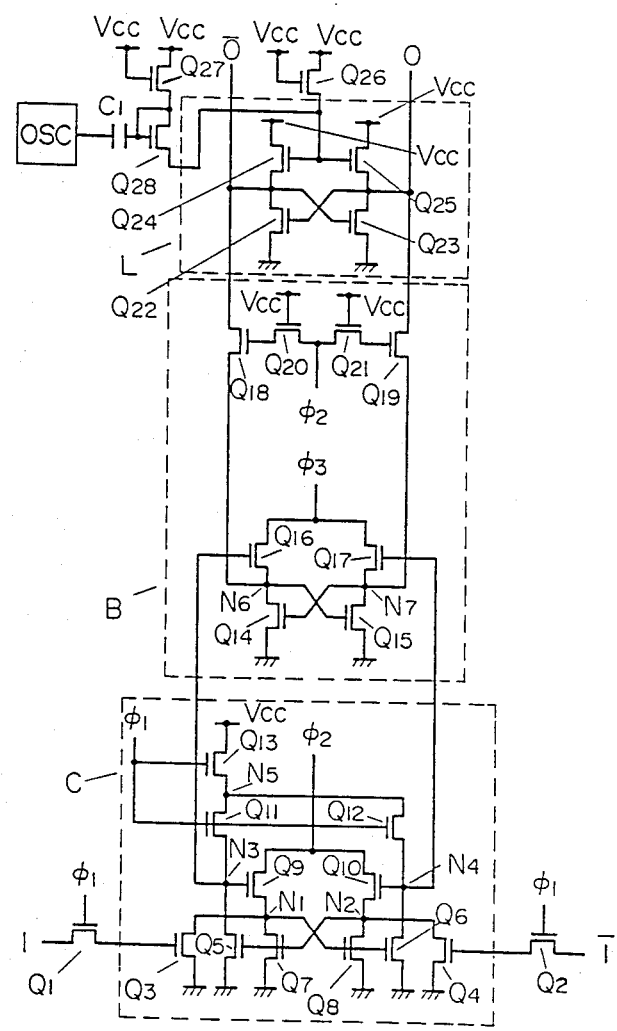
FIG. 2 is a circuit diagram showing the composition of one stage of the shift-register of this invention.

FIG. 2 shows one stage of a shift-register in an embodiment of this invention. Plural numbers of these stages constitute a shift-register. As shown in FIG. 2, each stage is composed of a comparator section C, a buffer section B and a latch section L.

Figure 3:
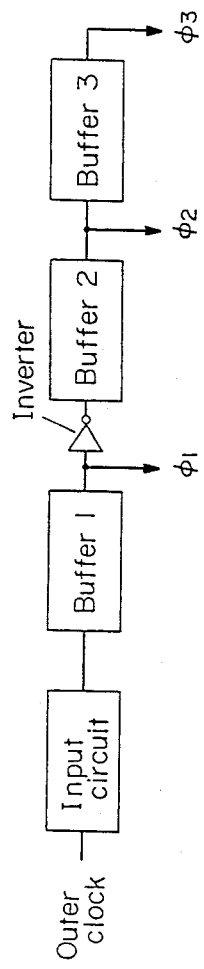
FIG. 3 shows a block diagram of a clock generator which generates clock signals $\phi_1$, $\phi_2$ and $\phi_3$ applied to the shift-register of this invention.
Figure 4:
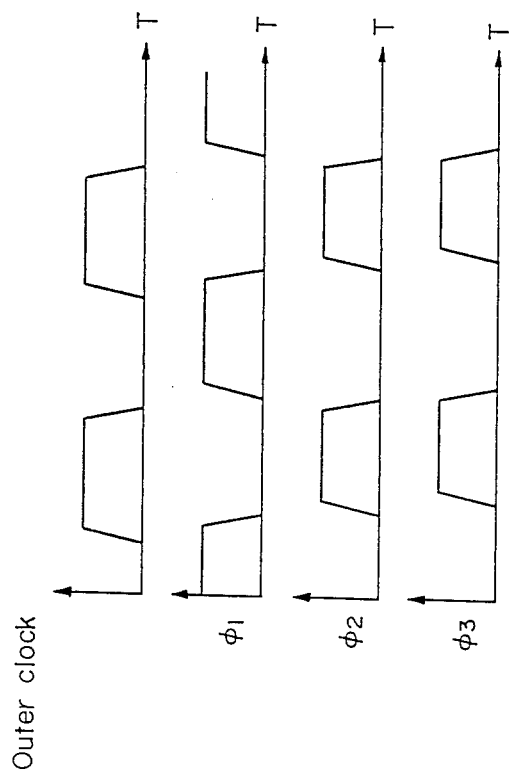
FIG. 4 is the timing diagram of clock signals $\phi_1$, $\phi_2$ and $\phi_3$.

FIG. 3 illustrates where the clock signals $\phi_1$, $\phi_2$ and $\phi_3$ are generated in the clock generator 108 in FIG. 1. The clock signals $\phi_1$, $\phi_2$ and $\phi_3$ shown in FIG. 4 are generated by means of the outer clock supplied through the input circuit, the buffers 1, 2 and 3, and the inverter. Clock signals $\phi_1$ and $\phi_2$ have opposite phases. Clock signal $\phi_3$ is slightly delayed from signal $\phi_2$.

Operation of the shift-register composed as shown in FIG. 2 is explained in detail in the following:

In FIG. 2, the input signals I and $\bar{\text{I}}$, from the input-output circuit 104, having mutually opposite phases, are applied to the gates of MOS transistors $Q_3$ and $Q_4$ which are the input points of the dynamic comparator C, via the transfer gates of the MOS transistors $Q_1$ and $Q_2$ which consist of MOS transistors.

When the first clock signal $\phi_1$ is in an "H" level, the input signals I and $\bar{\text{I}}$ are transmitted to the gates of the MOS transistor $Q_3$ and $Q_4$ respectively. Since the first clock signal $\phi_1$ is in an "H" level (=Vcc), and the second clock $\phi_2$ is in an "L" level in the comparator C at this time, and nodes $N_3$, $N_4$, and $N_5$ are charged up at a potential lower by the threshold voltage of MOS transistors than the power source voltage. Thus, since the nodes $N_3$ and $N_4$ are in an "H" level, and the second clock signal $\phi_2$ is in an "L" level, both nodes $N_1$ and $N_2$ are in an "L" level notwithstanding the input signals.

Under this condition, if the input signals I and $\bar{I}$ are "H" and "L" levels respectively, MOS transistor $Q_3$ is ON and MOS transistor $Q_4$ is in an OFF state. If the first clock signal $\phi_1$ becomes "L" next, the MOS transistors $Q_1$ and $Q_2$ become OFF, and at the gates of the MOS transistors $Q_3$ and $Q_4$, the information of the input signals I and $\bar{I}$ are sustained, and these conditions of the MOS transistors $Q_3$ and $Q_4$ would not be affected during the period when the first clock signal $\phi_1$ is kept at an "L" level regardless of the conditions of input signals I and $\bar{I}$. Furthermore, the electric charges are held at the nodes $N_3$, $N_4$, and $N_5$ because the MOS transistors $Q_{11}$, $Q_{12}$ and $Q_{13}$ are in an OFF state.

The second clock signal $\phi_2$ is then shifted from an "L" to "H" level, and the potentials of nodes $N_1$ and $N_2$ to rise since the MOS transistors $Q_9$ and $Q_{10}$ are in an ON state. In this situation, since MOS transistor $Q_3$ is ON, and MOS transistor $Q_4$ is in OFF, the electrical potential of node $N_2$ rises faster than that of the node $N_1$. Therefore, MOS transistors $Q_5$ and $Q_7$ reach an ON state earlier than $Q_6$ and $Q_8$, and the potential rising of node $N_1$ is suppressed, and at the same time, the charges stored at node $N_3$ are discharged through MOS transistor $Q_5$. As a result the potential of node $N_3$ decreases, and therefore, MOS transistor $Q_9$ is turned OFF, and the potential of node $N_1$ reduces also.

On the other hand, no discharge takes place at node $N_4$, since the potential of $N_1$ would not rise high enough to turn MOS transistor $Q_6$ ON, and since node $N_4$ is in a high impedance condition. Furthermore, due to the gate capacitance coupling effect at transistor $Q_{10}$, the node $N_4$ potential rises from the initial potential which is lower, by the threshold voltage of the MOS transistor, than the source voltage when the second clock becomes "H" level.

Therefore, when the input signal I is at an "H" level, node $N_4$ is at an "H" level, and node $N_3$ is at an "L" level. When the input $\bar{I}$ is at an "H" level, the results should be reversed. In the above described circuit operations, there exist no current paths which consume electric current constantly, that is, there are no current paths between Vcc and ground.

Since the comparison of input signal is performed by setting either one of the nodes $N_3$ or $N_4$ at an "L" level, and the feedback at the "H" level side is applied to the node on the "L" level side, and the comparison can be performed at high speed.

When the third clock signal $\phi_3$ is then changed from an "L" to an "H" level, the MOS transistors $Q_{14}$–$Q_{17}$ of the buffer B come into operation. At the initial condition, since both nodes $N_3$ and $N_4$ are at an "H" levels, MOS transistors $Q_{16}$ and $Q_{17}$ are in an ON state, and nodes $N_6$ and $N_7$ are, the same as the third clock signal $\phi_3$, at an "L" level. When the input I is at an "H" level, since the node $N_3$ is at an "L", and node $N_4$ is at an "H" level after the comparison is made, MOS transistor $Q_{16}$ is turned OFF, and the other MOS transistor $Q_{17}$ is in turned ON conditions.

Therefore, when the third clock signal $\phi_3$ rises to an "H" level, the potential of the node $N_7$ rises. At this time, due to the gate capacitance coupling effect of the MOS transistor $Q_{17}$, the potential of node $N_4$ rises to a higher potential than the potential which is reduced by the threshold voltage of the MOS transistor from the source voltage, and the node $N_7$ potential rises to the source voltage.

On the other hand, the MOS transistors $Q_{18}$ and $Q_{19}$ are turned ON through MOS transistors $Q_{20}$ and $Q_{21}$ because the second clock signal $\phi_2$ is at an "H" level. As a result, the potentials of nodes $N_6$ and $N_7$ are, as the output signal O and $\bar{O}$, transmitted to the succeeding next stage. As the case above, because of the gate capacitance coupling effects of MOS transistor $Q_{19}$, the output signal O maintains the source voltage potential. By utilizing the buffers which can change the impedance condition from a higher to a lower state, driven by the third clock signal $\phi_3$, the output O and $\bar{O}$ can drive a high capacitance load at high speed.

When the first clock signal $\phi_1$, by means of the outer clock, is returned from an "L" to an "H" level, the MOS transistors $Q_1$ and $Q_2$ which constitute the transfer gate are turned ON, and the input signals are again transmitted to the input of the comparator C. This dynamic comparator then starts, preparing for the coming comparator operation by the precharging of $N_3$, $N_4$, and $N_5$.

Then, as shown in FIG. 4, by means of the first clock signal $\phi_1$, the second clock signal $\phi_2$ goes to an "L" from an "H" level, and slightly later, the third clock signal $\phi_3$ goes to an "L" level from an "H" level, and the buffer B returns to its standby condition (i.e., reset to initial condition) ready for the coming amplification. The reason the timing of clock signal $\phi_3$ is delayed after that of $\phi_2$ is that if clock signal $\phi_3$ goes to an "L" level before clock signal $\phi_2$ goes to an "L" level, the charges indicating the "H" level of the output will discharge to ground through $Q_{14}$ and $Q_{15}$. In this case, in order to maintain the output signal O and $\bar{O}$, the latch circuit L comprising MOS transistors $Q_{22}$–$Q_{25}$ operates to hold the output signal O at an "H" level and the other output signal $\bar{O}$ at an "L" level at low impedance conditions.

In order to transfer the output signal to another circuit, for example, the next stage of the shift-register or the memory array, it is required to maintain for a long period the "H" level of the output signal O and $\bar{O}$ at the source voltage. In order to do this, a voltage higher than the source voltage, by the amount of the threshold voltage of MOS transistor, must be applied to the gates of MOS transistor $Q_{24}$ and $Q_{25}$. In order to accomplish such a function, in this embodiment, a pumping circuit comprised of a oscillator circuit OSC, MOS transistors $Q_{26}$–$Q_{28}$, and a capacitor $C_1$ is added to the latch circuit L. By means of this pumping circuit, the decrease in the holding period of the output voltage at an "H" level due to minute leakage can also be overcome. It should be noted that if it is not required to maintain the "H" level, the pumping circuit is not needed.

With the present invention, when the input signal is taken in by means of the first clock signal $\phi_1$, and by means of the second clock signal $\phi_2$, the output of the dynamic type comparator can be confirmed. However, because of the dynamic type, no penetration current is drained as set forth above. The buffer is then driven, by means of the third clock signal $\phi_3$, to change from a higher impedance to a lower impedance condition and to amplify the output of the dynamic comparator.

As explained above, the operations of the comparator and the amplifier are performed independently, and therefore, even with a high capacitance load, a high speed operation is possible. Moreover, since a latch circuit is provided at the output, even when the third clock signal $\phi_3$ goes to an "L" level, the output is connected to the power source or the ground potential at a low impedance, and there is no limitation for the output holding period. Furthermore, because of the dynamic type, the occupation area in a semiconductor chip can be minimized.

Therefore, according to this invention, a shift register which operates on low power consumption, is capable of driving a high capacitance load at a high speed, and has no limitation on the output holding time.

While specific embodiments of the invention have been illustrated and described herein, it is realized that modifications and changes will occur to those skilled in the art. It is therefore to be understood that the appended claims are intended to cover all modifications and changes as fall within the true spirit and scope of the invention.

What we claim is:

1. A memory device comprising:
   a least one memory array;
   at least one input-output circuit for transmitting a pair of input signals having mutually opposite phases;
   at least one clock generating circuit for generating a plurality of clock pulses;
   at least one shift register having a plurality of series connected stages, each of said stages having a dynamic comparator circuit comprising first and second transistor groups, said first and second transistor groups being controlled by said pair of input signals respectively and cooperating with each other under the control of said clock pulses so that a first node potential corresponding to said first transistor group makes a second node potential corresponding to said second transistor group rise, and said second node potential makes said first node potential drop, such that third and fourth node potentials corresponding to said first and second nodes respectively are fixed as a pair of fixed voltage signals, and each of said stages having a buffer circuit for receiving said pair of fixed voltage signals and for making an impedance condition change from a high impedance condition to a low impedance condition;
   a plurality of switching circuits for controlling signal transfer between each of said stages of said shift register and said at least one memory array by means of said clock pulses.

2. The memory device as claimed in claim 1, wherein said dynamic comparator further comprises:
   first and second MOS transistors for respectively transmitting said pair of input signals in response to a first clock pulse;
   third and fourth MOS transistors responsive to said pair of input signals and coupled to said first and second MOS transistors and;
   fifth and seventh MOS transistors coupled to and responsive to said second node potential;
   sixth and eighth MOS transistors coupled to an responsive to said first node potential;
   ninth and tenth MOS transistors having drain electrodes connected to said first and second nodes respectively, and having source electrodes supplied with a second clock pulse, said second clock pulse having a phase opposite that of said first clock pulse;
   means for supplying a potential to said third and fourth nodes responsive to said first clock pulse; wherein said third and fourth nodes are connected to gate electrodes of said ninth and tenth MOS transistors respectively.

3. The memory device as claimed in claim 2, wherein said pair of fixed voltage signals are a DC power source voltage and a ground voltage respectively.

4. A shift register comprising:
   a plurality of stages for transferring a pair of signals having mutual opposite phases, each of said stages comprising;
   two input terminals to which said pair of signals are transmitted;
   a dynamic comparator circuit comprising first and second transistor groups, said first and second transistor groups being respectively controlled by said pair of input signals and cooperating with each other under the control of said clock pulses so that a first node potential corresponding to said first transistor group makes a second node potential corresponding to said second transistor group rise, and said second node potential makes said first node potential drop, such that third and fourth node potentials corresponding to said first and second nodes respectively are fixed as a pair of fixed voltage signals,
   a buffer circuit for receiving said pair of fixed voltage signals and for changing an impedance condition from a high impedance condition to a low impedance condition,
   two output terminals responsive to said dynamic comparator circuit for transmitting said pair of fixed voltage signals to a succeeding stage.

5. The shift register as claimed in claim 4, wherein said dynamic comparator further comprises:
   first and second MOS transistors for respectively transmitting said pair of input signals in response to a first clock pulse;
   third and fourth MOS transistors respectively coupled to said first and second MOS transistors and responsive to said pair of input signals;
   fifth and seventh MOS transistors coupled to an responsive to said second node potential;
   sixth and eighth MOS transistors coupled to and responsive to said first node potential;
   ninth and tenth MOS transistors having drain electrodes connected to said first and second nodes respectively, and having source electrode supplied with a second clock pulse, said second clock pulse having a phase opposite that of said first clock pulse;
   a means for supplying a potential to third and fourth nodes responsive to said first clock pulse;
   said third and fourth nodes being connected to gate electrodes of said ninth and tenth MOS transistors respectively.

6. The shift register as claimed in claim 4, wherein each of said stages further comprises:
   a buffer circuit for receiving said pair of fixed voltage signals and for changing an impedance condition from a high impedance condition to a low impedance condition, and
   a latch circuit for holding said pair of fixed voltage signals by means of at least one pair of cooperating transistors.

7. The shift register as claimed in claim 6, wherein said latch circuit is comprised of:
   first and third MOS transistors having sources connected to a ground voltage and a DC power supply voltage respectively; and second and fourth MOS transistors having sources connected to a ground voltage and a DC power supply voltage respectively, wherein one of said pair of fixed voltage signals is supplied to drain electrodes of said first and third MOS transistors and to a gate electrode of said second MOS transistor, and wherein the other one of said pair of fixed voltage signals is supplied to drain electrodes of said second and fourth MOS transistors and to a gate electrode of said first MOS transistor, and wherein gate electrodes of said third and fourth MOS transistors are connected to a Vcc voltage via a fifth MOS transistor and connected to a pumping circuit in order to raise a potential of said gate electrodes of said third and fourth MOS transistors to a level higher than said DC power supply voltage.

8. The shift register as claimed in claim 4, wherein said pair of fixed voltage signals are a DC power supply voltage and a ground voltage respectively.

9. An electronic circuit comprising:

a dynamic comparator circuit comprised of first and second transistor groups, said first and second transistor groups being controlled by a pair of input signals respectively having mutually opposite phases and cooperating with each other under the control of clock pulses so that a first node potential corresponding to said first transistor group makes a second node potential corresponding to said second transistor group rise, and so that said second node potential makes said first node potential drop, and thereby third and fourth node potentials corresponding to said first and second nodes respectively are fixed as a pair of fixed voltage signals;

a buffer circuit for receiving said pair of fixed voltage signals and for changing an impedance condition from a high impedance condition to a low impedance condition; and, a latch circuit for holding said pair of fixed voltage signals by means of at least one pair of cooperating transistors.

10. The electric circuit as claimed in claim 9, wherein said dynamic comparator is further comprised of:

first and second MOS transistors for respectively transmitting said pair of input signals in response to a first clock pulse;

third and fourth MOS transistors coupled to and responsive to said pair of input signals respectively;

fifth and seventh MOS transistors coupled to and responsive to said second node potential;

sixth and eighth MOS transistors responsive to said first node potential;

ninth and tenth MOS transistors having drain electrodes connected to said first and second nodes respectively, and having source electrodes supplied with a second clock pulse, said second clock pulse having a phase opposite that of said first clock pulse;

means for supplying Vcc voltage to third and fourth nodes responsive to said first clock pulse;

said third and fourth nodes being connected to gate electrodes of said ninth and tenth MOS transistors respectively.

* * * * *